US008619489B2

(12) United States Patent
Castaldo et al.

(10) Patent No.: US 8,619,489 B2
(45) Date of Patent: Dec. 31, 2013

(54) DRIVING CIRCUIT FOR MEMORY DEVICE

(75) Inventors: Enrico Castaldo, Catania (IT); Antonio Conte, Tremestieri Etneo (IT); Gianbattista Lo Giudice, Pedara (IT); Stefania Rinaldi, Aci Catena (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 193 days.

(21) Appl. No.: 13/095,025

(22) Filed: Apr. 27, 2011

(65) Prior Publication Data
US 2011/0267891 A1 Nov. 3, 2011

(30) Foreign Application Priority Data

Apr. 30, 2010 (IT) ................ MI2010A0762

(51) Int. Cl.
*G11C 5/14* (2006.01)
(52) U.S. Cl.
USPC ........................................................ 365/226
(58) Field of Classification Search
USPC ................ 365/226, 227, 228, 226 O, 229
See application file for complete search history.

(56) References Cited

U.S. PATENT DOCUMENTS

| | | | |
|---|---|---|---|
| 5,687,116 A | 11/1997 | Kowshik et al. | |
| 5,798,966 A | 8/1998 | Keeney | |
| RE36,932 E * | 10/2000 | Furutani | 365/226 |
| 6,426,894 B1 | 7/2002 | Hirano | |
| 7,521,983 B2 * | 4/2009 | Ragone et al. | 327/427 |
| 2007/0115728 A1 | 5/2007 | Lambrache | |
| 2008/0266968 A1 | 10/2008 | Mori | |
| 2009/0161464 A1 | 6/2009 | Midorikawa et al. | |

OTHER PUBLICATIONS

Italian Search Report dated Dec. 7, 2010 from corresponding Italian Application No. MI20100762.
Written Opinion dated Dec. 7, 2010 from corresponding Italian Application No. MI20100762.

* cited by examiner

*Primary Examiner* — Vanthu Nguyen
(74) *Attorney, Agent, or Firm* — Wolf, Greenfield & Sacks, P.C.

(57) ABSTRACT

An electrically programmable non-volatile memory device is proposed. The memory device includes a plurality of memory cells and a driver circuit for driving the memory cells; the driver circuit includes programming means for providing a first programming voltage and a second programming voltage to a set of selected memory cells for programming the selected memory cells; the first programming voltage requires a first transient period for reaching a first target value thereof. In the solution according to an embodiment of the present invention, the programming means includes means for maintaining the second programming voltage substantially equal to the first programming voltage during a second transient period being required by the second programming voltage to reach a second target value thereof.

23 Claims, 10 Drawing Sheets

DRIVING CIRCUIT FOR MEMORY DEVICE

CROSS REFERENCE TO RELATED APPLICATIONS

This application claims the priority benefit of Italian patent application number MI2010A000762, filed on Apr. 30, 2010, entitled "Driving Circuit for Memory Device," which is hereby incorporated by reference to the maximum extent allowable by law.

BACKGROUND OF THE INVENTION

1. Field of Invention

One or more embodiments of the present invention relate to the electronic field. More specifically, embodiments relate to non-volatile memory devices.

2. Discussion of the Related Art

Non-volatile memory devices are used in any application that requires the storing of binary digits (or bits) of information that should be stored even when the memory devices are not powered.

An example of such memory devices is represented by $E^2PROM$ (Electrically Erasable and programmable read-only memory) memory devices. In general, each $E^2PROM$ memory device includes a matrix of memory cells, each one of which may be both programmed and erased electrically. Each memory cell includes two transistors: a memory transistor for storing the information bit and a selection transistor for selectively accessing the memory transistor during a reading, programming or erasing operation thereof. The memory transistor is typically a MOS transistor with a floating gate structure; such transistor has a drain terminal, a source terminal and a control terminal (control gate), in a totally similar manner to a standard MOS transistor, with the addition of a further floating control region (floating gate) that is buried in an oxide layer in order to be electrically isolated.

The information bit is physically stored, in the form of electric charge, within the floating gate; in fact a change of electric charge within the floating gate defines a corresponding change of a threshold voltage of the memory transistor; in particular, the memory cell is programmed at a low value of the threshold voltage (when electric charges are present within the floating gate) and erased at a high value of the threshold voltage (when the floating gate is free from electric charges). Such change of the threshold voltage determines, during a reading operation of the memory cell, a corresponding modulation of a channel current through the memory transistor, whose value represents the information bit stored in the memory cell.

Because of some criticalities detected in the memory cells during the programming operation thereof, the $E^2PROM$ memory devices offer performance that may not be entirely satisfactory in certain applications.

In particular, as is known, during the programming operation, an injection of electric charges occurs within the floating gate for effect of a phenomenon called "Fowler-Nordheim tunneling"; such technique provides for the formation of a strong electric field between the control gate and the drain terminal of the memory transistor, so that the electric charges are able to pass through the oxide layer and reach the floating gate buried therein.

During such programming operation, the source, drain and control terminals are biased in such a way that the memory transistor is turned off, i.e., it has no channel current from the drain terminal to the source terminal thereof; in fact, this would cause an unnecessary waste of electric power and a great difficulty to control the injection of electric charges within the floating gate.

However, the more and more increasing miniaturization of memory transistors in view of demands for high integration of the corresponding memory devices, involves that so-called "short-channel effects" (i.e., alterations of the electric properties of the transistors being caused by extremely small channel lengths) become more and more limiting.

A short-channel effect, known as "Drain-Induced Barrier Lowering" (DIBL), implies that, because of the voltage difference between the drain terminal and the source terminal of the memory transistor, a channel current may still generate during the programming operation, even in the absence of a command signal applied to its control terminal. For this reason, typically the source terminal of the memory transistor is biased, during the programming operation, at a voltage value high enough (and experimentally determined) to turn off the memory transistor for any voltage value at its drain terminal (technique known as source line pre-charge).

However, such solution is not fully satisfactory; in fact the biasing of the terminals of the memory transistor is performed through bias voltages that are typically generated and supplied by driver circuits implemented within the memory device; such driver circuits, not able to have an infinite bandwidth, provide the bias voltages in a finite time different from zero, according to a transient having a substantially ramp trend (instead of a step trend). Since each transient (of each bias voltage) has its own characteristic slope, it happens that, before the bias voltage at the source terminal of the memory transistor has reached a target value thereof (such as to inhibit its turning on), between the drain terminal and the source terminal of the memory transistor there is a voltage difference (corresponding to the slope difference of the transients of the respective bias voltages) such as to determine a channel current due to the above-mentioned DIBL effect. Such current, causing hot carrier injection within the oxide layer and the floating gate, determines an alteration of the threshold voltage of the memory transistor, which causes a substantial uncontrollability of the programming thereof; such phenomenon is cumulative, so that it is particularly harmful in applications that require a high number of programming and erasing operations (e.g., for memory cards for accessing pay television services, or "Pay-TV").

Even using driver circuits, which can be expensive, having such high performance that make the transients of the bias voltages more rapid, it would be difficult to have a complete cancellation of the DIBL effect, or to have such significant reduction thereof to justify the considerable needed additional costs.

SUMMARY

In its general terms, a summary solution according to one or more embodiments is based on the idea of limiting the differences between the bias voltages during their transients.

In particular, one or more aspects of the solution according to specific embodiments are set out in the independent claims, with advantageous features of the same solution that are indicated in the dependent claims (whose wording is enclosed herein verbatim by reference).

More specifically, an aspect of the solution according to an embodiment provides an electrically programmable non-volatile memory device. The memory device includes a plurality of memory cells and a driver circuit for driving the memory cells; the driver circuit includes programming means for providing a first programming voltage and a second programming voltage to a set of selected memory cells for programming the selected memory cells; the first programming voltage requires a first transient period for reaching a first target value thereof. In the solution according to an embodiment, the programming means includes means for maintaining the second programming voltage substantially equal to the first programming voltage during a second transient period required by the second programming voltage to reach a second target value thereof.

Another aspect of the solution according to an embodiment provides a corresponding method for programming the memory device.

BRIEF DESCRIPTION OF THE DRAWINGS

The solution according to one or more embodiments, as well as further features and the advantages thereof, will be best understood with reference to the following detailed description, given purely by way of a non-restrictive indication, to be read in conjunction with the accompanying drawings (wherein corresponding elements are denoted with equal or similar references, and their explanation is not repeated for the sake of exposition brevity). In this respect, it is expressly understood that the figures are not necessarily drawn to scale (with some details that may be exaggerated and/or simplified) and that, unless otherwise indicated, they are simply used to conceptually illustrate the described structures and procedures. In particular.

DETAILED DESCRIPTION

Figure 1:
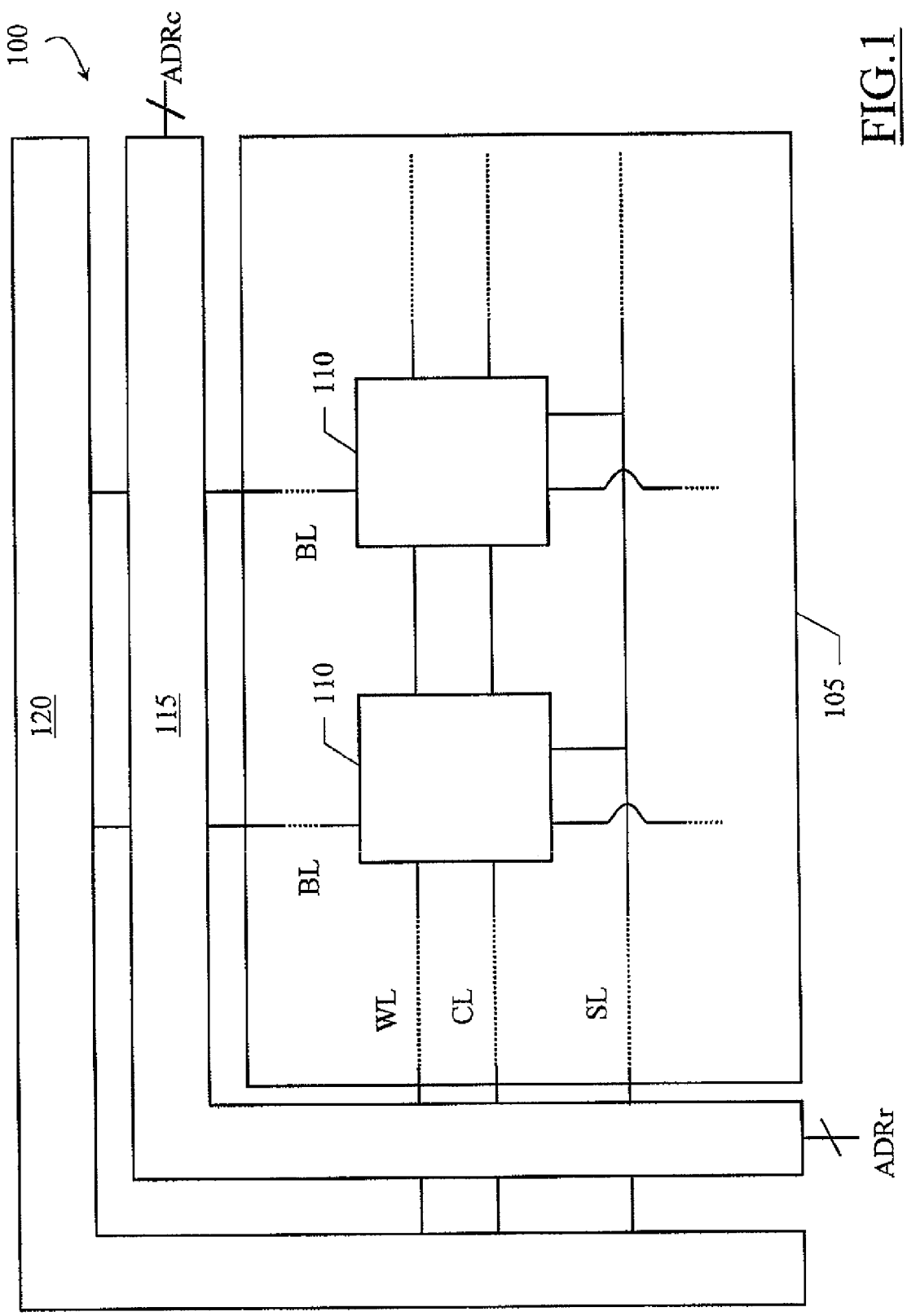
FIG. 1 is a principle block scheme of a non-volatile memory device in which the solution according to an embodiment is applicable.

With particular reference to FIG. 1, there is shown a principle block scheme of a non-volatile memory device 100 in which the solution according an embodiment of the invention is applicable; in particular, the memory device 100 is of the $E^2$PROM type. The memory device 100 includes a memory matrix 105, which is formed by a plurality of memory cells 110 (only two shown in the figure), being arranged in rows and columns (e.g., 128-512 rows and 512-1024 columns). On each memory cell 110 different operations may be performed, and in particular a programming, erasing and reading thereof. In the following, for the sake of exposition brevity and clarity, there will be introduced and described only functional blocks (relevant for the solution according to an embodiment of the present invention) directly involved in the programming operation of the memory cells 110.

The matrix 105 includes a plurality of bit lines BL, a plurality of word lines WL, a plurality of source lines SL, and a plurality of control lines CL. Each memory cell 110 of a same column of the matrix 105 is connected to a same bit line BL, while each memory cell 110 of a same row of the matrix 105 is connected to a same word line WL, control line CL and source line SL.

Each memory cell 110 to be programmed is selected through a corresponding address received from the outside of the memory device 100, which address is formed by a row address ADRr and a column address ADRc. To such purpose, a selection circuit 115 selects the word line WL, the bit line BL, the source line SL and the control line CL of the memory cell 110 on the basis of the row address ADRr and of the column address ADRc provided thereto by a suitable control logic (not shown in the figure); a driver circuit 120 provides (through the selection circuit 115) different bias voltages to be applied to the selected memory cell 110 for obtaining the programming thereof.

Figure 2:
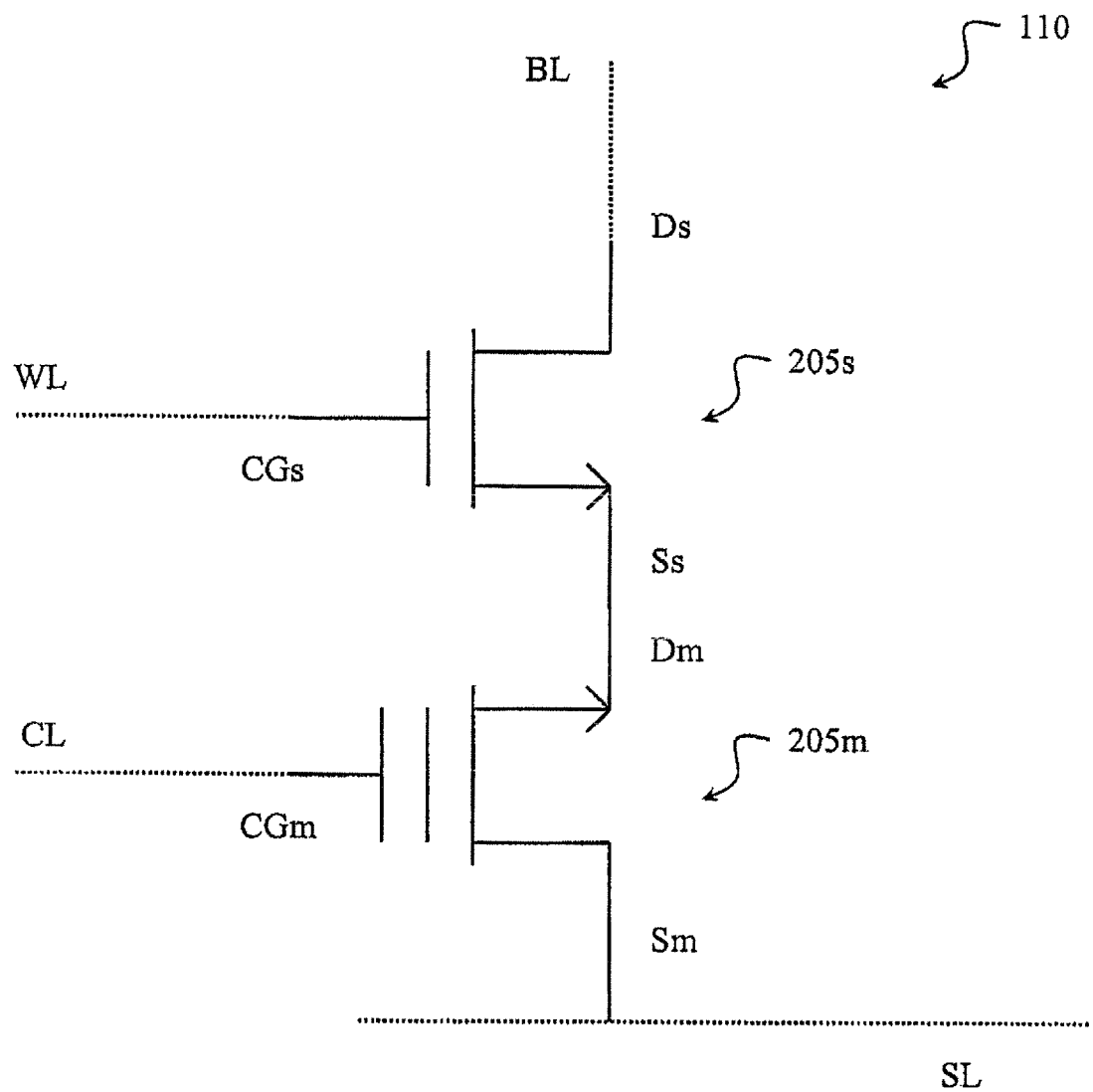
FIG. 2 shows an exemplary $E^2$PROM memory cell known in the state of the art.

Turning now to FIG. 2, there is shown an exemplary $E^2$PROM memory cell 110 known in the state of the art. The memory cell 110 stores a logical value (e.g., one bit); to such purpose, the memory cell 100 includes a memory transistor 205m for the programming thereof, and a selection transistor 205s for selecting the memory transistor 205m when it is desired to perform the programming operation. In particular, the memory transistor 205m is implemented through a floating gate MOS transistor, which has a drain terminal Dm, a source terminal Sm, and a control terminal CGm, with a floating gate region electrically isolated from the terminals Dm, Sm and CGm. Such transistor 205m has a threshold voltage that depends on an electric charge present in its floating gate. Different levels of the threshold voltage represent corresponding logical values; conventionally, the memory cell 110 is erased (e.g., at a logical value 0) when it has a high threshold voltage (e.g., 2V), while the memory cell 110 is programmed (e.g., at a logical value 1) when it has a low threshold voltage (e.g., 0.2 V).

The selection transistor 205s of the memory cell 110 is implemented through a standard N-channel MOS transistor, having a drain terminal Ds, a source terminal Ss connected to the drain terminal Dm of the memory transistor 205m, and a control terminal CGs.

The memory cell 110 is implemented within the memory device in such a way that the drain terminal Ds, the control terminal CGs (of the selection transistor 205s), the source terminal Sm and the control terminal CGm (of the memory transistor 205m) are connected to the corresponding bit line BL, word line WL, source line SL and control line CL of the matrix, respectively.

During the programming operation, the memory cell 110 is selected by applying a selection voltage VCGs at the control terminal CGs to turn on the selection transistor 205s and to allow to a programming voltage VDs applied to its drain terminal Ds to be transferred to the drain terminal Dm of the memory transistor 205m; in order to have such transfer effective, the programming voltage VDs has a value lower than the selection voltage VCGs by at least one threshold voltage of the selection transistor 205s (so as to avoid an anticipated turning off thereof before the drain terminal Dm has reached the selection voltage VCGs); typical values of such voltages are, for example, VCGs=14.5V and VDs=12.5V.

Meanwhile, the control terminal CGm is maintained at a lower selection voltage VCGm, for example, equal to a ground voltage (0V); in this way, a Fowler-Nordheim current is generated that injects electric charges into the floating gate of the memory transistor 205m, thereby causing a decrease of the corresponding threshold voltage.

The source terminal Sm is biased to a programming voltage VSm of a sufficiently high value to avoid that, for any voltage provided to the drain terminal Dm (equal to the programming voltage VDs), there is no channel current between the terminals Dm and Sm. The value of the programming voltage VSm for avoiding such situation is experimentally determined, and, in the considered example, it is equal to 6V.

Figure 3:
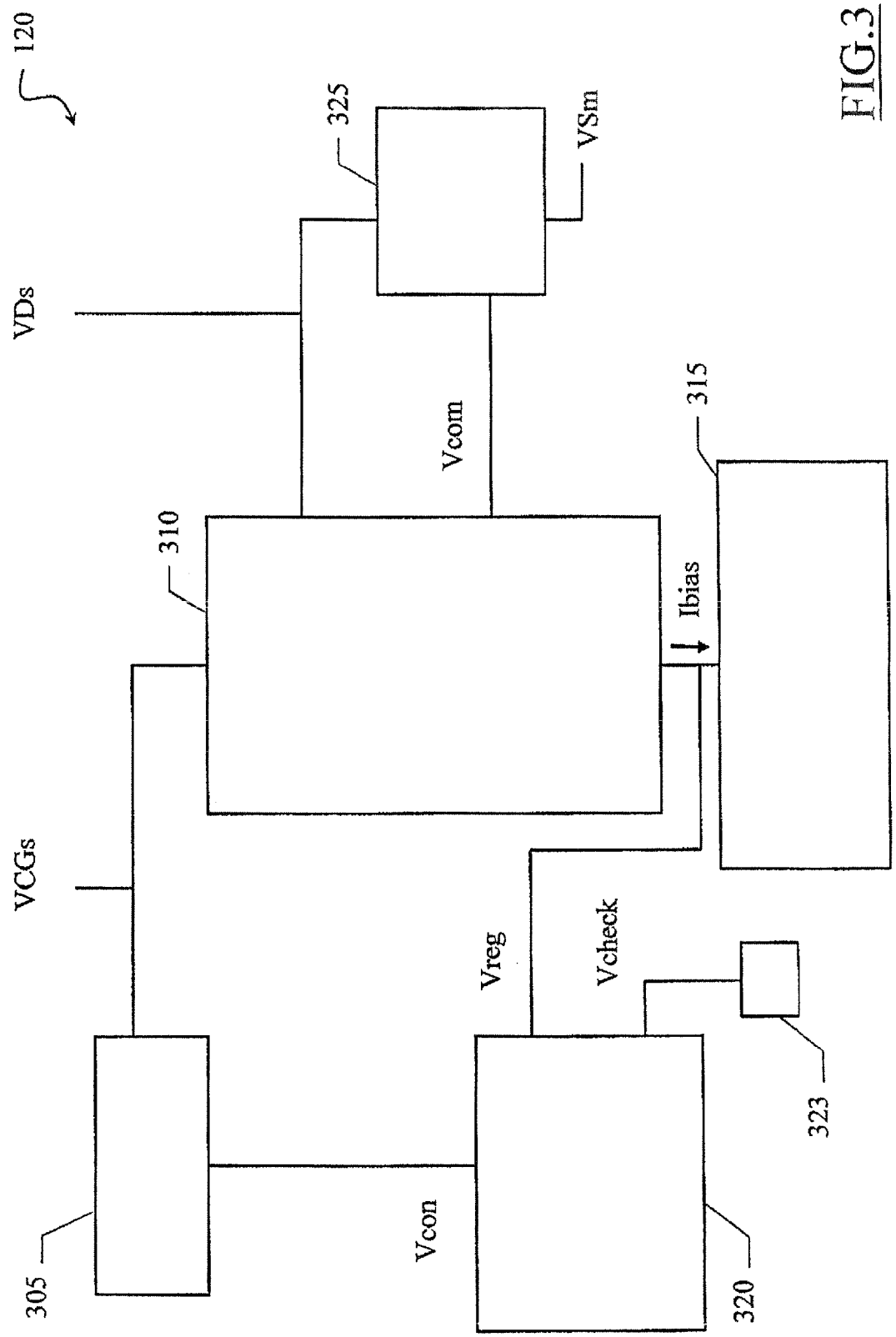
FIG. 3 shows, in terms of functional blocks, a driver circuit of the memory device known in the state of the art.

Turning now to FIG. 3, there is shown, in terms of functional blocks, the driver circuit 120, known in the state of the art, for generating and providing the voltages VCGs, VDs, VSm to the memory cell during the programming operation. The driver circuit 120 includes a charge pump 305, able to generate the selection voltage VCGs from an external supply voltage of the memory device having a smaller value (e.g., 1.8-3V). The driver circuit 120 also includes a regulator circuit 310 (e.g., in open loop configuration) for generating the programming voltage VDs and a command voltage Vcom from the selection voltage VCGs, a bias circuit 315 for biasing the regulator circuit 310, and a control circuit 320 for feedback controlling the charge pump 305.

In particular, the regulator circuit 310 is biased through a bias current Ibias, which is supplied by the bias circuit 315. The regulator circuit 310 inputs the selection voltage VCGs provided by the charge pump 305, and provides, to the control circuit 320, a regulation voltage Vreg depending on the selection voltage VCGs (e.g., obtained from the latter through a partition, as it will be seen in detail in the following); the control circuit 320 generates and provides a control voltage Vcon to the charge pump 305 based on a comparison between the regulation voltage Vreg and a comparison voltage Vcheck of fixed value provided by a distribution block 323; such control voltage Vcon, acting in known manner on proper parameters of the charge pump 305, allows a regulation of the selection voltage VCGs up to a target value thereof. Starting from the selection voltage VCGs, the regulator circuit 310 generates the programming voltage VDs and the command voltage Vcom, which will be used (as it will be explained shortly) for generating the programming voltage VSm. To such purpose, the driver circuit 120 further includes a buffer circuit 325, which receives the programming voltage VDs and the command voltage Vcom, and provides the programming voltage VSm.

Figure 4A:
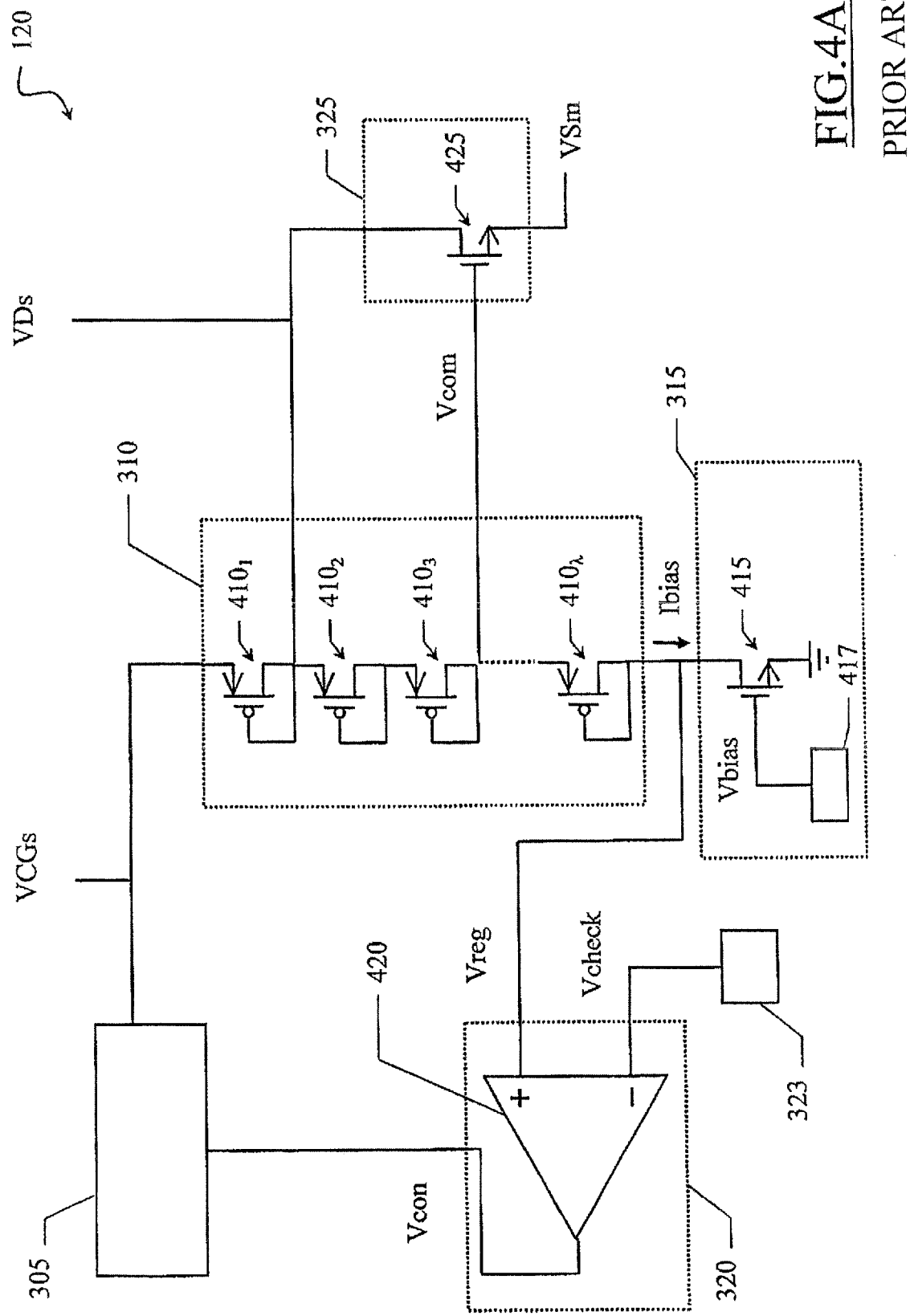
FIG. 4A-4B show a known circuit implementation of some circuit blocks of the driver circuit of FIG. 3 and a corresponding trend of some voltages thereof, respectively.
Figure 4B:
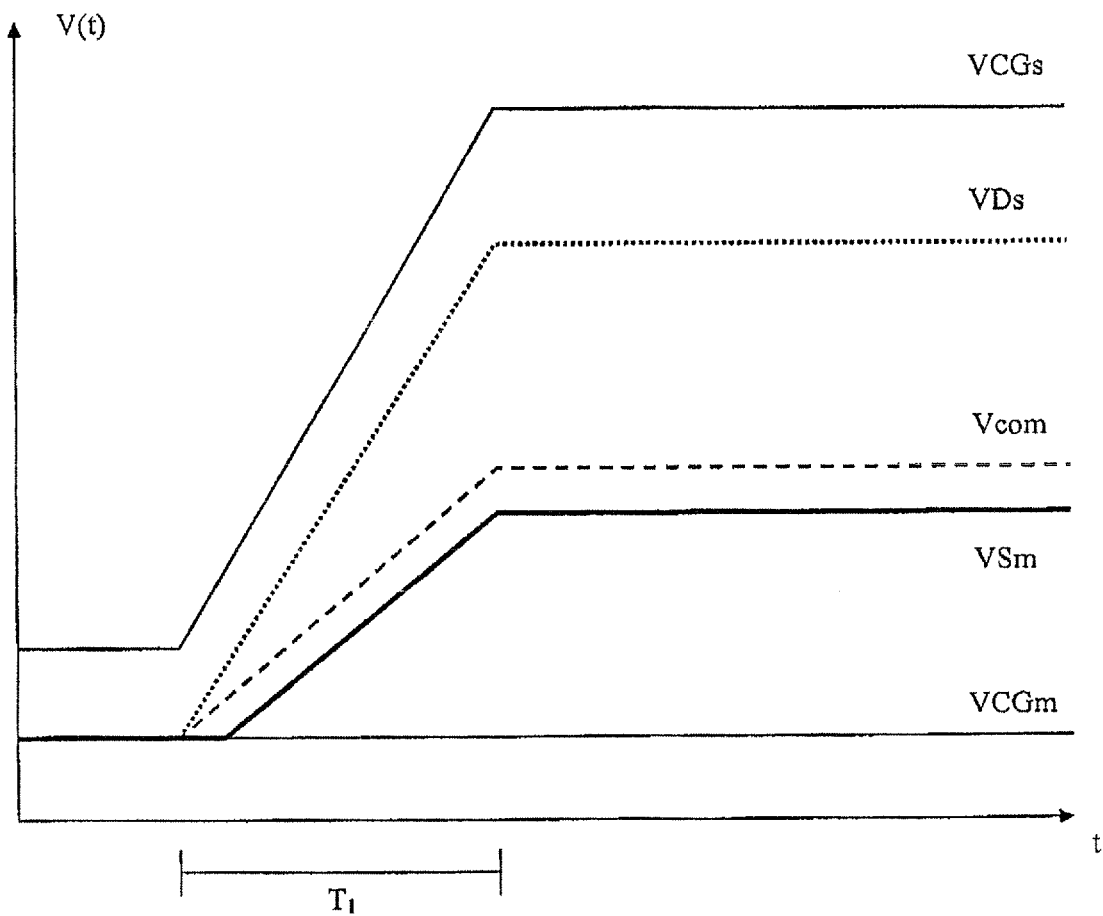

With reference to FIG. 4A-4B, they show a known circuit implementation of some circuit blocks of the driver circuit 120 and a corresponding trend of some voltages thereof, respectively. With particular reference to FIG. 4A, the regulator circuit 310 includes a chain of P-channel MOS transistors $410i$ ($i=1, 2, \ldots \lambda$—for example, $\lambda=20$). Each transistor $410i$ is in diode-connected configuration (i.e., with a gate terminal short-circuited to a drain terminal, in such a way that the drain terminal defines an anode and the source terminal defines a cathode). The drain terminal of each transistor $410i$ is coupled to a source terminal of the following transistor $410i$ in the chain; at each one of such coupling there is identified a corresponding node of the chain. Two distinct nodes of the chain of transistors $410i$, in the considered example the first and the third nodes (in the direction of the current flow) provide the programming voltage VDs and the command voltage Vcom, respectively.

A first transistor $410_1$ of the chain has the source terminal coupled to the charge pump 305 for receiving the selection voltage VCGs; a last transistor $410_\lambda$ of the chain has the drain terminal coupled to the bias circuit 315 for receiving the bias current Ibias. More in detail, the bias circuit 315 includes a bias transistor 415, for example, of the N-channel MOS type, having a drain terminal coupled to the drain terminal of the last transistor $410_\lambda$ and a source terminal coupled to a reference terminal (that provides a reference or ground voltage); a distribution block 417 provides a bias voltage Vbias of fixed value (e.g., 1V) to a gate terminal of the bias transistor 415; in this way, the bias voltage Vbias forces the corresponding bias current Ibias through the bias transistor 415, and thus through the chain of transistors $410i$.

The drain terminal of the last transistor $410_\lambda$ (that provides the voltage Vreg) is connected to a non-inverting input terminal (indicated with the sign "+") of an operational amplifier 420, which implements the control circuit 320. In particular, an inverting terminal (indicated with the sign "−") of the operational amplifier 420 receives the (fixed) comparison voltage Vcheck; in this way, the operational amplifier 420, acting as a comparator, performs a comparison between the voltage Vreg and the comparison voltage Vcheck, and outputs the control voltage Vcon.

The buffer circuit 325 is typically implemented through a transistor (e.g., of the N-channel MOS type) 425 in voltage-follower configuration, which has a drain terminal for receiving the programming voltage VDs, a gate terminal for receiving the command voltage Vcom and a source terminal providing the programming voltage VSm.

The operation of the driver circuit 120 so implemented can be summarized as follows (with reference to FIG. 4A jointly to FIG. 4B).

During a transient period $T_1$ required by the selection voltage VCGs for reaching a target value thereof starting from an initial voltage (e.g., of about 4V), an increase of the selection voltage VCGs applied to the source terminal of the first transistor $410_1$ distributes on each node of the chain of transistors $410i$, thereby determining an increase of the voltage at the drain terminal of the bias transistor 415, and consequently an increase of the bias current Ibias; in fact, since the bias transistor 415 has the gate and source terminals at fixed voltages (at the voltage Vbias and at ground, respectively), the increase of the voltage to its drain terminal results in a corresponding increase of the bias current: this involves a re-biasing of the nodes of the chain of transistors $410i$ (for balancing such increase), so that all the transistors $410i$ conduct the same (new) bias current Ibias.

As long as the comparator 420 detects that the regulation voltage Vreg is lower than the comparison voltage Vcheck, the control voltage Vcon provided by it will be such that the charge pump 305 increases the value of the selection voltage VCGs (thereby a substantially ramp trend being shown in FIG. 4B); once reached the target value of the selection voltage VCGs (in the specific case equal to 14.5V), the control voltage Vcon will be such that the charge pump 305 stops increasing the selection voltage VCGs ("plateau" phase, as shown in FIG. 4B).

Since the nodes of the chain follow the variations of the selection voltage VCGs, also the programming voltage VDs and the command voltage Vcom have a similar ramp trend (of the same transient period $T_1$) followed by a respective plateau phase; naturally, each one of such trends, as shown in FIG. 4B, has its own specific slope and its own specific target value (in the considered example 12.5V and 6.7V) depending on the entity of the partition by the chain of transistors $410i$ on the selection signal VCGs.

Finally, the command voltage Vcom, by turning on the transistor 425, allows a transfer of the programming voltage VDs from its drain terminal to its source terminal. In such condition, the programming voltage VSm and the command voltage Vcom are strictly connected to each other; in particular, since the transistor 425 remains turned on until the voltage between its gate terminal and its source terminal becomes lower than its threshold voltage, the programming voltage VSm will turn out to be lower than the command voltage Vcom by such threshold voltage; in other words, the programming voltage VSm is shifted down (with respect to the command voltage Vcom) by the threshold voltage, as shown in FIG. 4B.

Therefore a finite time exists (defined by the transient time $T_1$, necessary by the programming voltage VSm for reaching its target value—equal to 6V in the example at issue) in which between the terminals Ds and Sm there is a voltage difference due to the different slope of the corresponding programming voltages VDs, VSm (which may cause a corresponding channel current).

Figure 5:
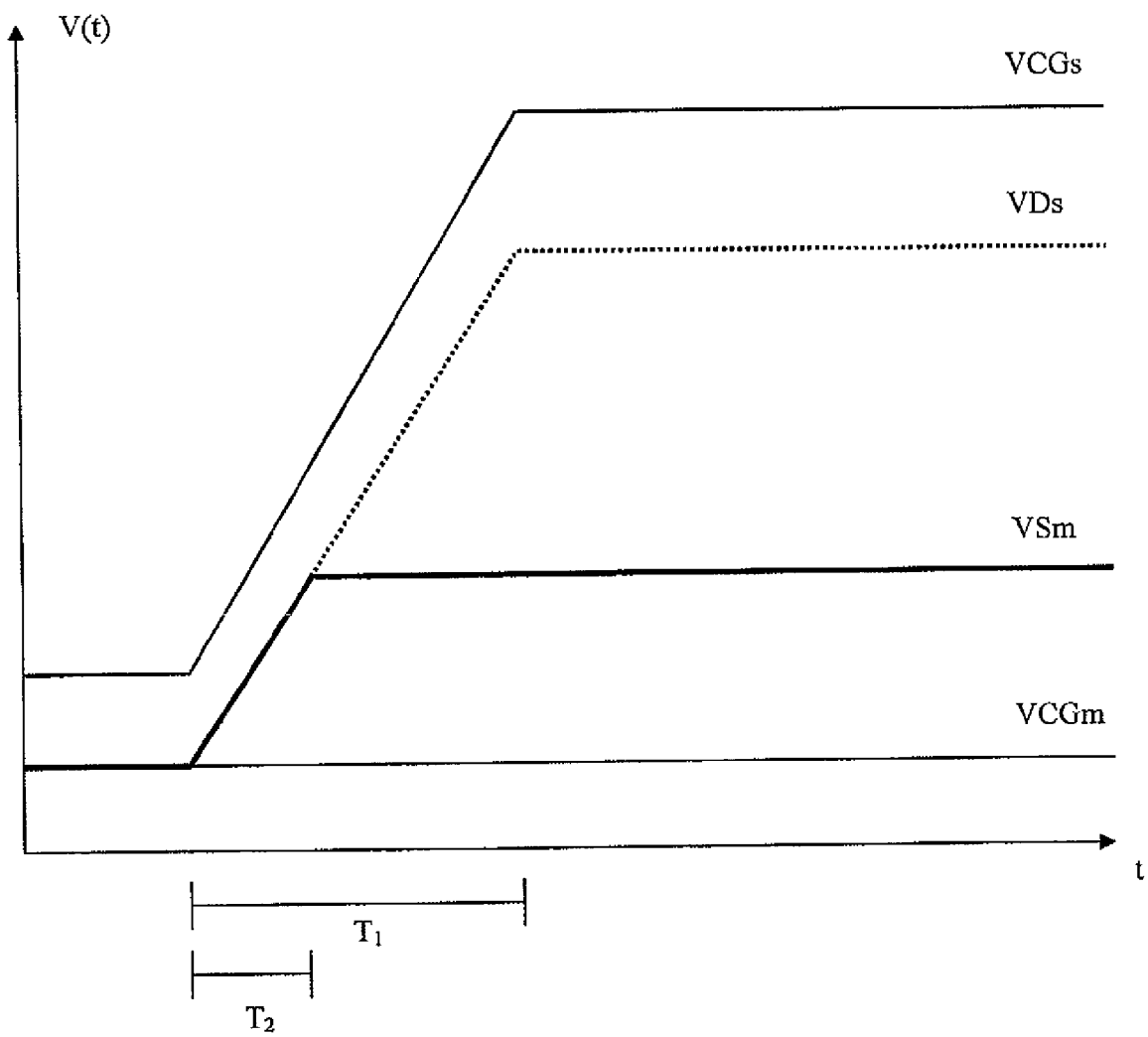
FIG. 5 schematically shows a trend of the same voltages according to an embodiment.

FIG. 5 schematically shows a trend of the same voltages VCGs, VDs, VSm, VCGm according to an embodiment of the present invention; as visible in such figure, the voltages VCGs, VDs and VCGm have the same trend as the known embodiment. Unlike the latter, however, the programming voltage VSm has now a slope substantially equal to the slope of the selection voltage VCGs until its target value (6V), at which the programming voltage VSm follows a plateau trend (fixed to its target value). In this way, since the target value of the programming voltage VSm is lower than the target value of the selection voltage VCGs, the programming voltage VSm has a transient period $T_2$ lower than the transient period $T_1$.

Such solution is advantageous because, during the transient period $T_2$ the difference between the programming voltages VDs, VSm is significantly reduced, if not eliminated; this allows preventing any channel current to flow during such transient period $T_2$ thereby altering the programming status of the memory cell. After the transient period $T_2$, the programming voltage VSm is at the target value such as to prevent, during the subsequent increase of the programming voltage VDs, unwanted turning on of the memory transistor.

Figure 6:
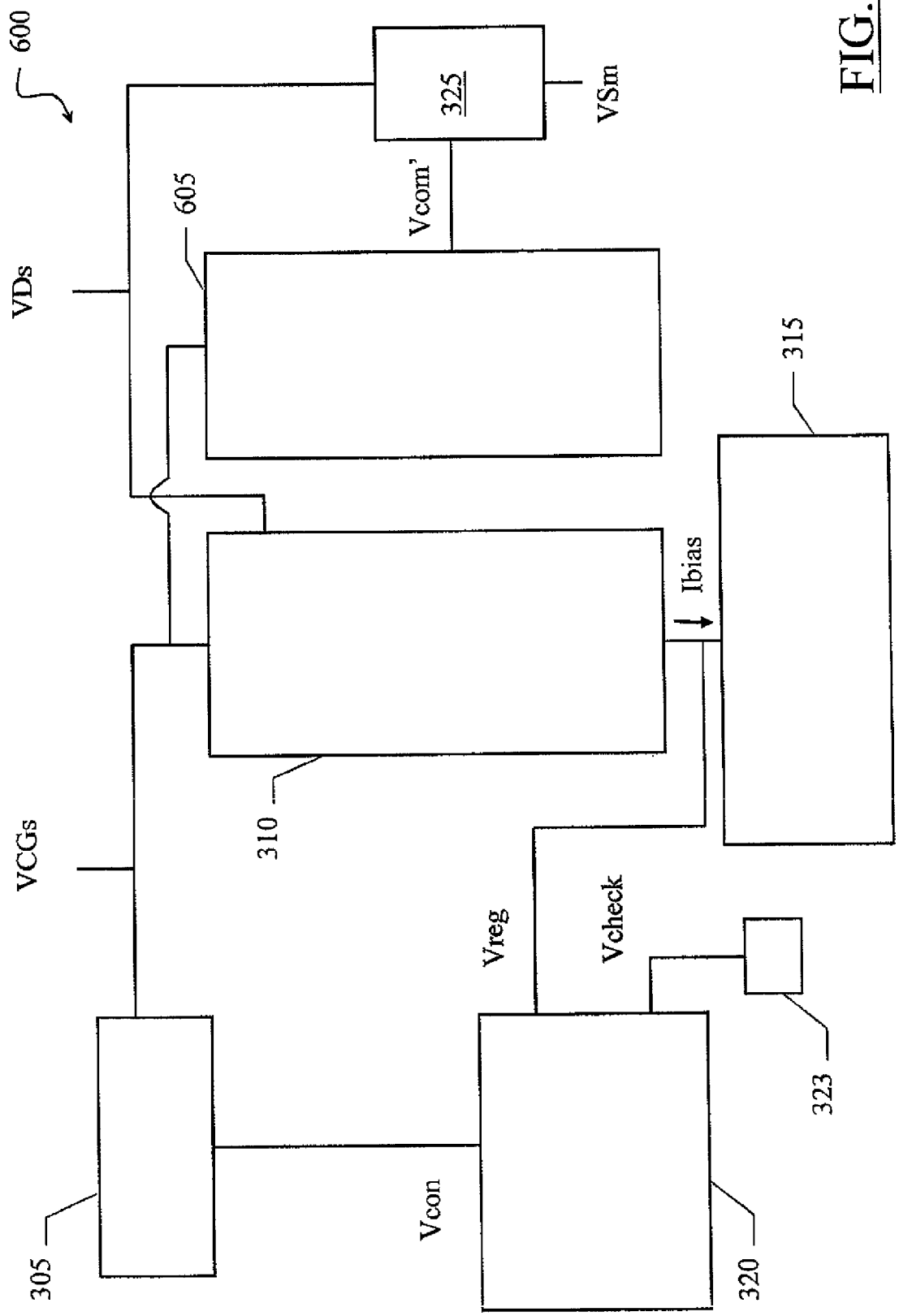
FIG. 6 shows, in terms of functional blocks, a driver circuit according to an embodiment.

FIG. 6 shows, in terms of functional blocks, a driver circuit 600 according to an embodiment of the invention. The driver circuit 600, analogously to the above-described driver circuit, includes the charge pump 305 for generating the selection voltage VCGs, the regulator circuit 310 for generating, from the selection voltage VCGs, the programming voltage VDs and the regulation voltage Vreg, the bias circuit 315 for biasing the regulator circuit 310, the control circuit 320 for receiving the regulation voltage Vreg and the comparison voltage Vcheck (supplied by the distribution block 323) and generating the corresponding control signal Vcon for controlling the charge pump 305, and the buffer circuit 325 for receiving the programming voltage VDs and providing the programming voltage VSm. In addition, the driver circuit 600 further includes a regulator circuit 605, which receives the same selection voltage VCGs and provides a further command voltage Vcom' to the buffer circuit 325 for generating the programming voltage VSm.

Figure 7A:
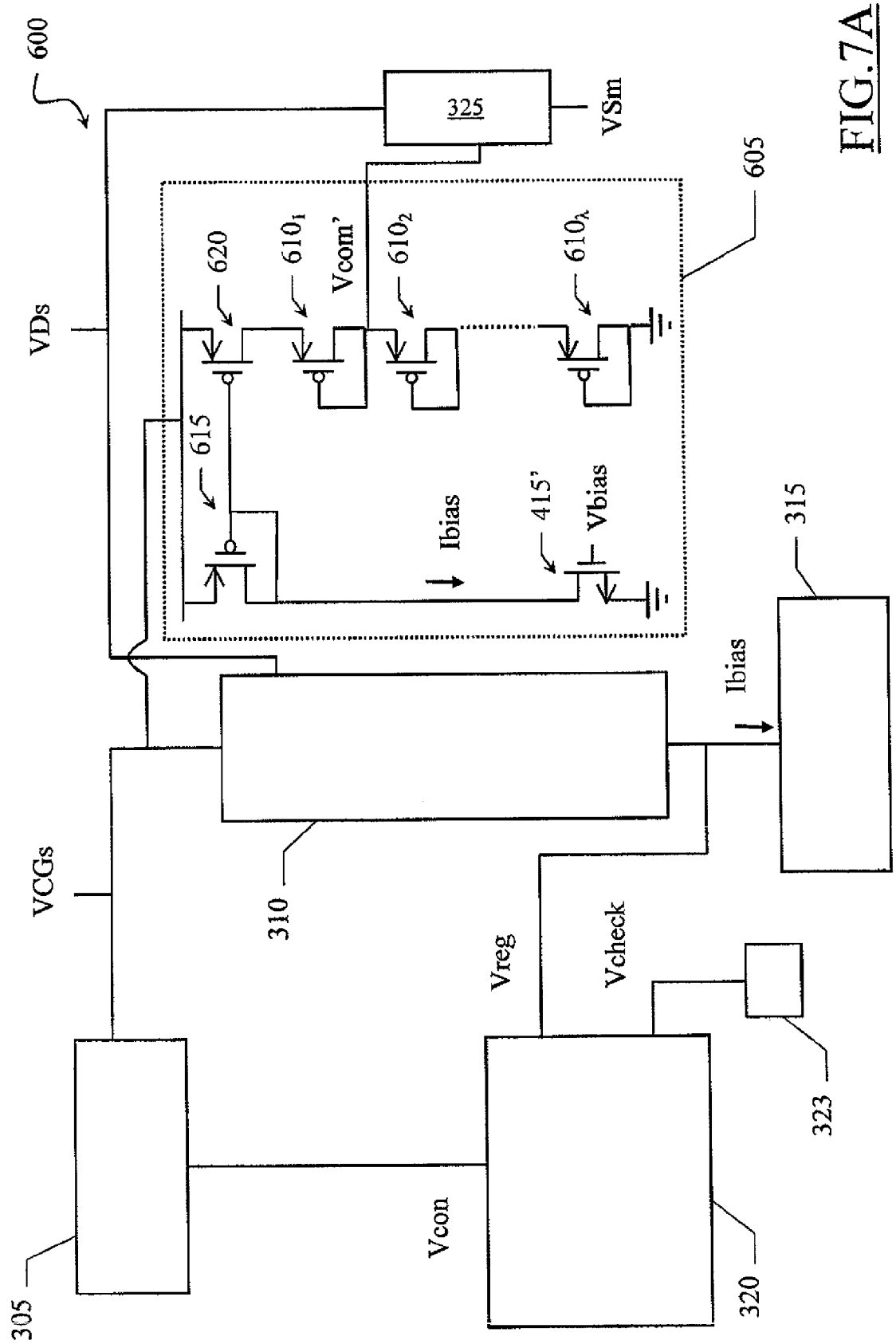
FIG. 7A-7B show a circuit implementation of some functional blocks of the driver circuit of FIG. 6 and a corresponding trend of some voltages thereof, respectively.
Figure 7B:
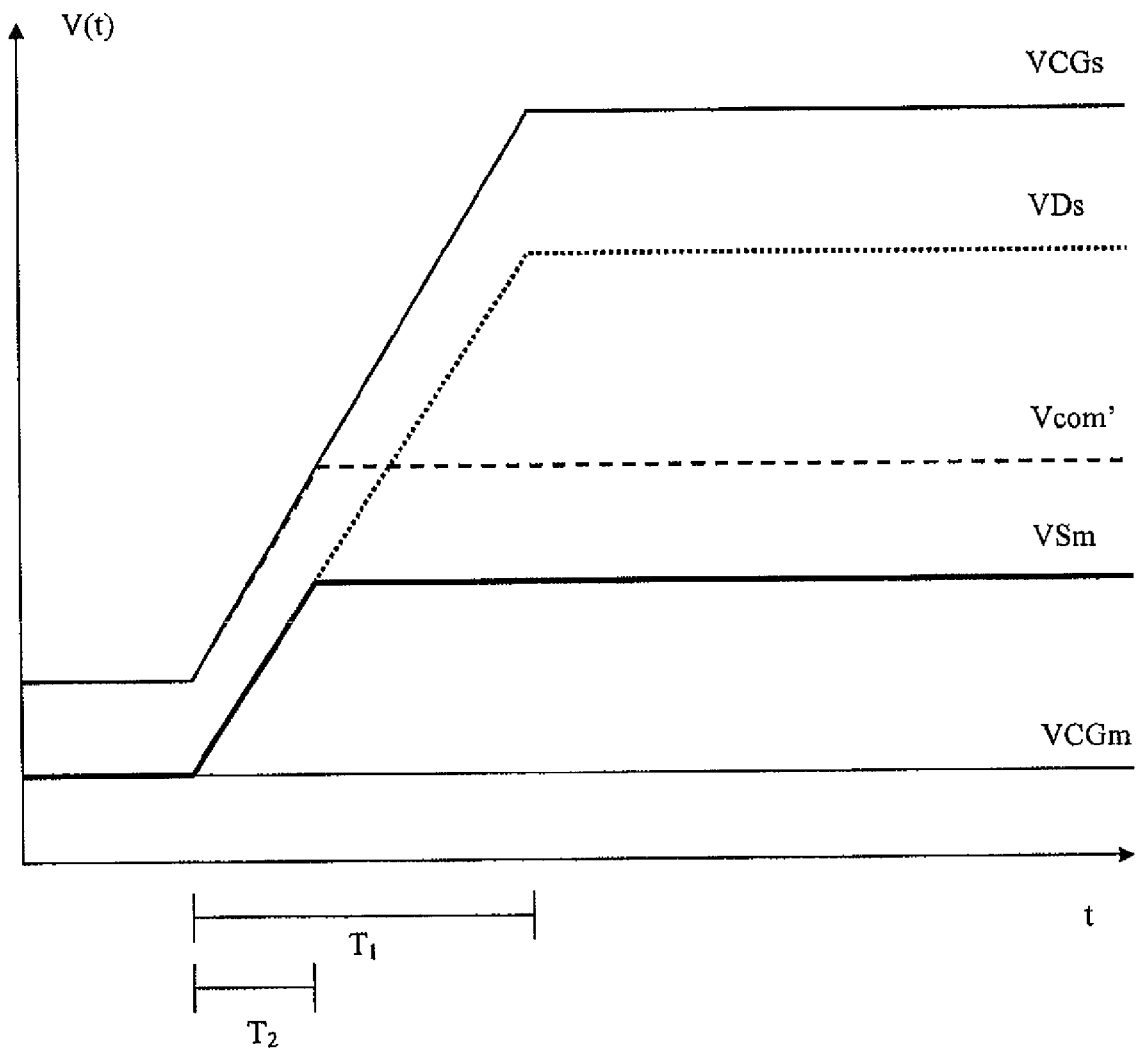

FIG. 7A-7B show a circuit implementation of some functional blocks of the driver circuit 600 and a corresponding trend of some voltages thereof, respectively.

In particular, with reference to FIG. 7A, the regulator circuit 605 includes a further chain of P-channel MOS transistors $610i$ ($i=1, 2, \ldots \lambda$—for example, $\lambda=16$) diode-connected, in a quite analogous way to the chain of transistors $410i$ used in the regulator circuit 310 (but in general with a lower number of transistors $610i$). A node of the chain of transistors $610i$ (in the shown example, the first in the direction of the current flow) provides the command voltage Vcom' to the buffer circuit 325. A drain terminal of a last transistor $610_\lambda$ of the chain is connected to the ground terminal.

The regulator circuit 605 also includes two transistors 615, 620 (e.g., of P-channel MOS type) implementing a current mirror; in particular, the transistor 615, which defines a first branch of the current mirror, has a source terminal for receiving the selection voltage VCGs and a gate terminal connected to a drain terminal thereof (i.e., in diode-connected configuration). The transistor 620, which defines a second branch of the current mirror, has a source terminal for receiving the selection voltage VCGs, a drain terminal coupled to the source terminal of a first transistor $610_1$ of the chain, and a gate terminal connected to the gate terminal of the transistor 615.

The regulator circuit 605 also includes a bias transistor 415' (analogous to the bias transistor 415), with a drain terminal connected to the drain terminal of the transistor 615, a source terminal connected to the ground terminal and a gate terminal receiving the same bias voltage Vbias (electrical connection not shown for simplicity of representation). In this way, both the branches of the current mirror conduct the same bias current Ibias.

The operation of the regulator circuit 605 according to the described embodiment may be summarized as follows (with reference to FIG. 7A jointly to FIG. 7B).

For low values of the selection voltage VCGs (e.g., up to about 4V), the bias transistor 415' turns out to be not very conductive, or in linear regime, since it has a small voltage between its drain terminal and its source terminal; therefore, the second branch of the current mirror 615, 620 and the transistors $610i$ of the chain, conducting a bias current Ibias significantly lower than its target value, are similar to resistors implementing a partition network (analogously to that described for the regulator circuit 310). In such situation, the command voltage Vcom' substantially follows the trend of the selection voltage VCGs, since between the respective nodes there is a resistive coupling; in particular, the command voltage Vcom', taken at the first node of the chain of transistors $610i$, is derived from a partition of negligible entity of the voltage selection VCGs. When the selection voltage VCGs reaches a value such that both the branches of the current mirror 615, 620 are crossed by the target value of the bias current Ibias, the bias transistor 415', the transistors of the chain $610i$ and the transistors of the current mirror 615, 620 are in a (saturation) operating region such that they are no longer similar to resistors; in such condition, the resistive coupling between the node providing the selection voltage VCGs and the node providing the command voltage Vcom' breaks, and the latter is clamped at a fixed value (depending on the voltage at the nodes of the chain of transistors $610i$ in response to the bias current Ibias at its target value, and substantially equal to the sum of the threshold voltages of the transistors $610i$ of the chain). Also in this case, the fixed value of the command voltage Vcom' is equal to the programming voltage VSm with the addition of the threshold voltage of the transistor that implements the buffer circuit 325.

Each subsequent increase of the selection voltage VCGs causes an increase of the voltage at the gate terminal of the transistor 615, and thus at the drain terminal of the bias transistor 415' (without however altering the bias current Ibias), but not at the drain terminal of the transistor 620; the latter, in fact, once voltage-fixed through the bias current Ibias, is decoupled from the node that provides the selection voltage VCGs.

Finally, analogously to the above-described case, the buffer circuit 325 provides the programming voltage VSm, which is shifted by a threshold voltage with respect to the control voltage Vcom' (as visible in FIG. 7B).

Figure 8:
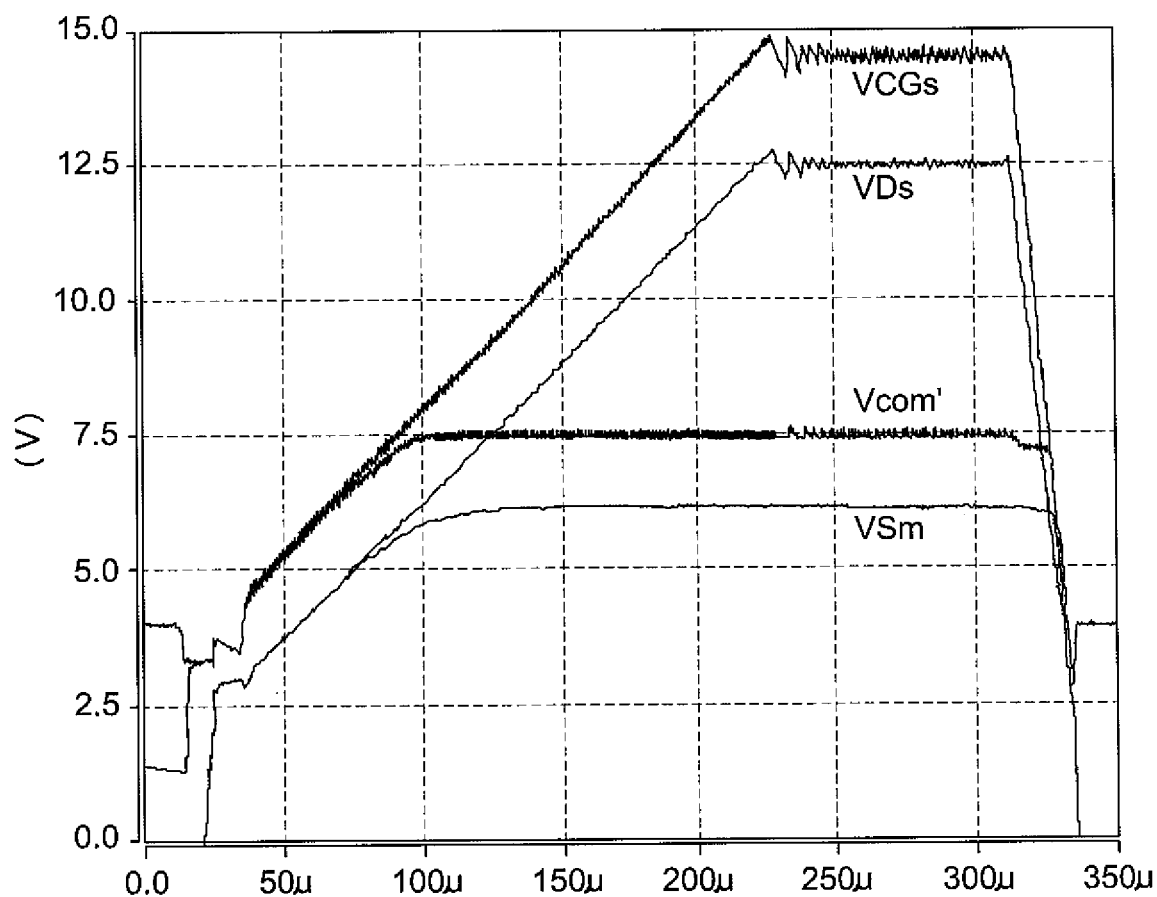
FIG. 8 shows an example of trend of the above voltages obtained by simulations of the driver circuit of FIG. 7A.

With reference to FIG. 8, there is shown an example of trends of the above voltages obtained by simulations of the driver circuit of FIG. 7A. As visible in such figure, the trends of the voltages VCGs, VDs, Vcom', VSm obtained by the simulations reproduce faithfully their trends (theorized and derived from a simple manual circuit analysis) reported in FIG. 7B.

The described solution is advantageous since, by exploiting only few additional components with respect to the known implementation, it allows obtaining the desired result of greatly reducing the difference between the programming voltages VDs and VSm during the transient period $T_2$ required by the programming voltage VSm to reach its target value.

Naturally, in order to satisfy local and specific requirements, a person skilled in the art may apply to the solution described above many logical and/or physical modifications and alterations. More specifically, although the present invention has been described with a certain degree of particularity with reference to preferred embodiments thereof, it should be understood that various omissions, substitutions and changes in the form and details as well as other embodiments are possible. In particular, different embodiments of the invention may even be practiced without the specific details (such as the numeric examples) set forth in the preceding description for providing a more thorough understanding thereof; on the contrary, well known features may have been omitted or simplified in order not to obscure the description with unnecessary particulars. Moreover, it is expressly intended that specific elements and/or method steps described in connection with any disclosed embodiment of the invention may be incorporated in any other embodiment as a matter of general design choice.

In particular, similar considerations apply if the memory device has a different structure or includes equivalent components (either separated from each other or combined together, in whole or in part); moreover, the above-described values of the programming voltages and of the selection voltages should not be construed in a limitative way for the present invention, as they are to be selected, in the design phase, on the basis of topological and circuital, as well as technological and economic considerations.

Many charge pumps, or equivalent circuits, may be provided within the memory device; in any case, the possibility of providing the voltage having higher value directly from the outside of the memory device is not excluded.

The same considerations are valid if the regulator circuit is configured not only for generating the command voltage, but also the programming voltage to be applied to the drain terminal of the selection transistor; this can be achieved, for example, by using proper synchronization circuits that allow the regulator circuit to generate such voltages in a serial mode. In any case, a simplified implementation without any feedback control is possible.

Alternatively, the same result can be obtained with different architectures (also based on a single regulator circuit).

Moreover, nothing prevents making one or both the regulator circuits by diodes chains, or other electronic components that, in proper topological configurations, implement similar functionalities.

The nodes of the chain used for taking the programming, selection and command voltages may be arbitrarily chosen, and depending on the configuration used for implementing the regulator circuits, the type of components used and their electrical features (such as the threshold voltage for the transistors or a turning on voltage for the diodes).

The same considerations are valid if the current mirror is replaced by a different circuit able to decouple the charge pump from the node providing the command voltage once it has reached its target value (e.g., with an active control).

The buffer circuit may be implemented in a different way; for example, it is possible to provide the use of one or more Darlington stages (e.g., having two or three transistors), also made through bipolar transistors.

The memory device can be of the $E^2PROM$ type, or even flash. Moreover, the memory cell may be implemented in a different way, e.g., by more memory and/or selection transistors for each cell, compatibly with the architecture of the memory device.

Moreover, the solution according to an embodiment lends itself to be implemented through an equivalent method (by using similar steps, removing some steps being not essential, or adding further optional steps); moreover, the steps may be performed in different order, concurrently or in an interleaved way (at least partly).

It should be readily understood that the proposed structure may be part of the design of an integrated circuit. The design may also be created in a programming language; moreover, if the designer does not manufacture the electronic devices or the masks, the design may be transmitted by physical means to others. In any case, the resulting integrated circuit may be distributed by its manufacturer in raw wafer form, as a bare die, or in packages. Moreover, the proposed structure may be integrated with other circuits in the same chip, or it may be mounted in intermediate products (such as mother boards) and coupled with one or more other chips (such as a processor). In any case, the integrated circuit is suitable to be used in complex systems (such as automotive applications or microcontrollers).

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An electrically programmable non-volatile memory device including a plurality of memory cells and a driver circuit for driving the memory cells, the driver circuit including programming means for providing a first programming voltage and a second programming voltage to a set of selected memory cells for programming the selected memory cells, the first programming voltage requiring a first transient period for reaching a first target value thereof, the programming means including means for maintaining the second programming voltage substantially equal to the first programming voltage during a second transient period required by the second programming voltage to reach a second target value thereof, wherein the programming means includes supply means for providing a supply voltage higher than the first programming voltage in absolute value, and regulation means for generating the first programming voltage and the second programming voltage from the supply voltage.

2. The memory device according to claim 1, further including:

a control circuit for controlling the supply voltage, the control circuit including means for providing a regulation voltage depending on the supply voltage, means for providing a comparison voltage, and means for controlling the supply means according to a comparison between the regulation voltage and the comparison voltage.

3. The memory device according to claim 2, wherein the regulation means includes:
   a first regulator circuit for generating the first programming voltage at least by shifting the supply voltage by a predetermined voltage offset,
   a second regulator circuit for generating a clamped voltage by clamping the supply voltage at the second target value plus a further voltage offset and
   a buffer circuit for generating the second programming voltage from the clamped voltage, the second programming voltage being shifted by the further voltage offset with respect to the clamped voltage.

4. The memory device according to claim 3, wherein the first regulator circuit includes:
   a chain of diode elements connected in series between an initial terminal and a final terminal, the initial terminal being coupled with the supply means for receiving the supply voltage, and
   biasing means coupled with the final terminal for providing a biasing current to the chain, the final terminal providing the regulation voltage, and the chain having an intermediate node between a pair of adjacent diode elements for providing the first programming voltage.

5. The memory device according to claim 4, wherein the second regulator circuit includes:
   a further chain of further diode elements connected in series between a further initial terminal and a further final terminal, the further final terminal being coupled with a reference terminal for receiving a reference voltage, the further chain having a further intermediate node between a pair of further adjacent diode elements for providing the clamped voltage, and
   coupling means between the further initial terminal and the supply means, the coupling means coupling the further initial terminal with the supply means to cause the further initial terminal to substantially receive the supply voltage until the clamped voltage has not reached the second target value plus the further offset voltage and for decoupling the further initial terminal from the supply means otherwise.

6. The memory device according to claim 5, wherein the coupling means includes a current mirror circuit referred to the supply voltage, the current mirror having a first branch for receiving the biasing current and a second branch coupled with the further initial terminal.

7. The memory device according to claim 3, wherein the buffer circuit includes at least one voltage follower-connected transistor having a follower first conduction terminal for receiving the first programming voltage, a follower second conduction terminal for providing the second programming voltage, and a follower control terminal for receiving the clamped voltage.

8. The memory device according to claim 1, wherein the memory device is of the $E^2PROM$ type, each memory cell including:
   a storage transistor for storing information having a storage first conduction terminal, a storage second conduction terminal, and a storage control terminal, the storage second conduction terminal being coupleable with the regulation means for receiving the second programming voltage, and
   a select transistor for selecting the storage transistor having a select first conduction terminal, a select second conduction terminal and a select control terminal, the select control terminal being coupled with the supply means for receiving the supply voltage, the select first conduction terminal being coupled with the regulation means for receiving the first programming voltage, and the select second conduction terminal being coupled with the storage first conduction terminal.

9. A method for programming an electrically programmable non-volatile memory including a plurality of memory cells, the method including the steps of:
   providing a first programming voltage and a second programming voltage to a set of selected memory cells for programming the selected memory cells, the first programming voltage requiring a first transient period for reaching a first target value thereof, and
   maintaining the second programming voltage substantially equal to the first programming voltage during a second transient period required by the second programming voltage to reach a second target value thereof, wherein providing a first programming voltage and a second programming voltage comprises providing a supply voltage higher than the first programming voltage in absolute value and generating the first programming voltage and the second programming voltage from the supply voltage.

10. The method for programming an electrically programmable non-volatile memory as defined in claim 9, further comprising providing a regulation voltage depending on the supply voltage, providing a comparison voltage, and controlling the supply voltage according to a comparison between the regulation voltage and the comparison voltage.

11. The method for programming an electrically programmable non-volatile memory as defined in claim 9, wherein providing the first programming voltage and the second programming voltage comprises generating the first programming voltage by shifting the supply voltage by a predetermined first voltage offset, generating a clamped voltage by clamping the supply voltage at the second target value plus a second voltage offset, and generating the second programming voltage from the clamped voltage, the second programming voltage being shifted by the second voltage offset with respect to the clamped voltage.

12. A driver circuit for an electrically programmable non-volatile memory device including a plurality of memory cells, comprising:
   a first circuit, responsive to a selection voltage, configured to provide a first programming voltage to first terminals of a selected set of the memory cells, the first programming voltage requiring a first transient period to reach a first target value; and
   a second circuit, responsive to the selection voltage, configured to provide a second programming voltage to second terminals of the selected set of the memory cells, wherein the second circuit is configured to maintain the second programming voltage substantially equal to the first programming voltage during a second transient period required by the second programming voltage to reach a second target value, wherein the first circuit comprises a first regulator circuit configured to provide the first programming voltage and wherein the second circuit comprises a second regulator circuit, responsive to the selection voltage, to provide a command voltage, and a buffer circuit, responsive to the first programming voltage and the command voltage, to provide the second programming voltage.

13. The driver circuit as defined in claim 12, wherein the first programming voltage is applied to the bit lines of the selected set of memory cells and the second programming voltage is applied to the source lines of the selected set of memory cells.

14. The driver circuit as defined in claim 12, further comprising a voltage supply configured to provide the selection voltage higher than the first programming voltage in absolute value.

15. The driver circuit as defined in claim 14, further comprising a control circuit configured to control the voltage supply, wherein the control circuit is configured to receive a regulation voltage from the first circuit, to receive a comparison voltage, and to control the voltage supply based on a comparison between the regulation voltage and the comparison voltage.

16. The driver circuit as defined in claim 15, wherein the first regulator circuit is configured to generate the first programming voltage by shifting the selection voltage by a predetermined first voltage offset, the second regulator circuit is configured to generate the command voltage by clamping the selection voltage at the second target value plus a second voltage offset, and the buffer circuit is configured to generate the second programming voltage from the command voltage, the second programming voltage being shifted by the second voltage offset with respect to the command voltage.

17. The driver circuit as defined in claim 16, wherein the first regulator circuit includes a first chain of diode elements connected in series between a first initial terminal and a first final terminal, the first initial terminal being connected to the voltage supply for receiving the selection voltage, the driver circuit further comprising a bias circuit coupled to the first final terminal and configured to provide a bias current to the chain of diode elements, the first final terminal providing the regulation voltage, and the first chain of diode elements having a first intermediate node between a pair of adjacent diode elements for providing the first programming voltage.

18. The driver circuit as defined in claim 17, wherein the second regulator circuit includes a second chain of diode elements connected in series between a second initial terminal and a second final terminal, the second final terminal coupled to a reference voltage, the second chain of diode elements having a second intermediate node between a pair of adjacent diode elements for providing the command voltage, and a coupling circuit between the second initial terminal and the selection voltage, the coupling circuit configured to cause the second initial terminal to receive the selection voltage until the command voltage has reached the second target value plus the second offset voltage and to decouple the second initial terminal from the supply voltage otherwise.

19. The driver circuit as defined in claim 18, wherein the coupling circuit includes a current mirror circuit referred to the selection voltage, the current mirror circuit having a first branch for receiving the bias current and a second branch coupled to the second initial terminal.

20. The driver circuit as defined in claim 16, wherein the buffer circuit includes a follower-connected transistor having a first conduction terminal for receiving the first programming voltage, a second conduction terminal for providing the second programming voltage and a control terminal for receiving the command voltage.

21. A method for programming an electrically programmable non-volatile memory device including a plurality of memory cells, comprising:

providing, in response to a selection voltage, a first programming voltage to first terminals of a selected set of the memory cells, the first programming voltage requiring a first transient period to reach a first target value; and providing, in response to the selection voltage, a second programming voltage to second terminals of the selected set of the memory cells, including maintaining the second programming voltage substantially equal to the first programming voltage during a second transient period required by the second programming voltage to reach a second target value, wherein providing a first programming voltage and a second programming voltage comprises providing a supply voltage higher than the first programming voltage in absolute value and generating the first programming voltage and the second programming voltage from the supply voltage.

22. The method for programming an electrically programmable non-volatile memory as defined in claim 21, further comprising providing a regulation voltage depending on the supply voltage, providing a comparison voltage, and controlling the supply voltage based on a comparison between the regulation voltage and the comparison voltage.

23. The method for programming an electrically programmable non-volatile memory as defined in claim 21, wherein providing the first programming voltage and the second programming voltage comprises generating the first programming voltage by shifting the supply voltage by a predetermined first voltage offset, generating a clamped voltage by clamping the supply voltage at the second target value plus a second voltage offset, and generating the second programming voltage from the clamped voltage, the second programming voltage being shifted by the second voltage offset with respect to the clamped voltage.

\* \* \* \* \*